United States Patent [19]

Shih et al.

[11] Patent Number: 5,723,352

[45] Date of Patent: Mar. 3, 1998

[54] PROCESS TO OPTIMIZE PERFORMANCE AND RELIABILITY OF MOSFET DEVICES

[75] Inventors: Jiaw-Ren Shih; Shion Hann Liaw, both of Hsiu-Chu, Taiwan

[73] Assignee: Taiwan Semiconductor Manufacturing Company, Hsinchu, Taiwan

[21] Appl. No.: 511,064

[22] Filed: Aug. 3, 1995

[51] Int. Cl.$^6$ .............................. H01L 21/8234
[52] U.S. Cl. ..................... 437/44; 437/41 RLD; 437/913
[58] Field of Search ................ 437/44, 41 RLD, 437/913, 41 SW, 40 SW, 29

[56] References Cited

U.S. PATENT DOCUMENTS

| 4,366,613 | 1/1983 | Ogura et al. ............... 29/571 |
| 5,089,432 | 2/1992 | Yoo ............................ 437/40 |
| 5,091,763 | 2/1992 | Sanchez ................ 437/41 RLD |
| 5,151,376 | 9/1992 | Spinner, III ................ 437/228 |
| 5,393,685 | 2/1995 | Yoo et al. .................... 437/44 |
| 5,472,895 | 12/1995 | Park .......................... 437/44 |
| 5,476,803 | 12/1995 | Liu ........................... 437/44 |

Primary Examiner—Tom Thomas
Assistant Examiner—Michael Trinh
Attorney, Agent, or Firm—George O. Saile

[57] ABSTRACT

A process for fabricating MOSFET devices, in which performance, as well as reliability enhancements, are included, has been developed. An LDD process, using first an ion implanted phosphorous step, to address hot carrier lifetime phenomena, followed by a arsenic ion implantation step, used to improve device performance, is described.

20 Claims, 3 Drawing Sheets

PROCESS TO OPTIMIZE PERFORMANCE AND RELIABILITY OF MOSFET DEVICES

BACKGROUND OF THE INVENTION

1. Field of the Invention

The present invention relates to a process used to fabricate metal oxide silicon field effect transistors, (MOSFET), devices, and more specifically to a method used to enhance device performance, while maintaining reliability.

2. Description of Prior Art

The semiconductor industry is continually striving to reduce the cost of chips, while still attempting to improve the device performance, as well as maintaining or improving device reliability. The goal of reducing cost has been addressed by fabricating smaller chips, containing the same level of integration as their previous larger counterparts. With a greater number of chips placed on a specific sized wafer, and with the cost of producing the wafer being the same, the cost per chip can be significantly reduced. The major direction used by the semiconductor industry, in reducing chip size, has been a reduction of specific chip dimensions. This has allowed not only reductions in chip size to occur, but also has resulted in higher performing devices due to reductions in resistances, etc, creating reductions in delay times, etc.

Reductions in specific chip dimensions, or images have been greatly accomplished via successes in the photolithographic discipline. More advanced exposure cameras, as well as the development of more sensitive photoresist materials, have allowed sub-micron images in photoresist to be routinely obtained. In addition similar developments in the dry etching sectors have allowed these sub-micron images, in photoresist, to be successfully transferred to underlying materials. Other semiconductor fabrication disciplines, such as ion implantation, (I/I), and low pressure chemical vapor deposition, (LPCVD), have also contributed to the trend to micro-miniaturazation.

The trend to decrease specific device dimensions, while reducing cost, and improving performance, can however present specific reliability concerns. For example the hot electron phenomena, prevalent in narrow channel length MOSFET devices, has to be addressed as chip features, including gate electrode widths, are reduced. The hot electron, or hot carrier lifetime effect, (HCE), is negatively influenced by thinner gate insulators, narrower channel lengths, and increasing concentration gradients involving source and drain diffusions. Since thinner gate insulators, as well as narrower channel lengths, enhance device performance, most device designers are unwilling to relax these device aspects. Therefore to continue to achieve device performance, while still maintaining HCE protection, drain engineering was developed. Ogura, etal, in U.S. Pat. No. 4,366,613, showed that a lightly doped drain, (LDD), process, applied after polysilicon gate definition, at a lower concentration than the standard source and drain process, can result in performance enhancements, due to narrow channel lengths, while minimizing HCE phenomena by reductions experienced with the LDD process. After a sidewall spacer is fabricated, the standard, higher doping level, source and drain process, can be carried out. The HCE effect will be mainly influenced by the LDD regions, interfacing the channel region, not the more highly doped source and drain areas, separated from the channel region by the thickness of the spacer insulator.

Although the LDD process has allowed performance and reliability aspects to be optimized, modern devices still require further performance enhancements, without sacrificing reliability, to satisfy design needs. For example if a phosphorous LDD process is used, subsequent process heat cycles will spread the phosphorous LDD to a point in which the phosphorous concentration, interfacing the channel region, will be significantly lowered, to where HCE effects are minimize. However on the negative side the reduction in LDD concentration results in an area of higher resistance, between the channel region and the standard source and drain region. This area of higher resistance negatively impacts device performance in terms of saturation drain current, (Idsat), as well as a reduction in Ioff margains. On the other hand if an arsenic LDD process is employed, the less out-diffusion, or spreading, at subsequent process heat cycles, will result in a more conductive area between the channel region and standard source and drain regions. This will results in higher Idsat, than observed with phosphorous LDD counterparts. However the use of an arsenic LDD results in a greater risk of HCE effects due to the higher LDD concentration gradient at the channel region. This invention will describe a process in which both device performance and reliability concerns are addressed by a novel process using a hybrid LDD process in which both arsenic and phosphorous are employed.

SUMMARY OF THE INVENTION

It is an object of this invention to provide a process for fabricating MOSFET devices in which lightly doped source and drain regions are used.

It is another object of this invention to fabricate the lightly doped source and drain regions using an ion implantation process, with self alignment to a polycide gate structure.

It is still another object of this invention to use both arsenic, as well phosphorous, ion implanted dopants, to create the lightly doped region of the MOSFET device.

In accordance with this present invention a process for fabricating MOSFET devices is described, which uses a lightly doped source and drain region, created by an ion implantation process consisting of both arsenic, as well as phosphorous implanted species. The process begins by forming thick field oxide regions, for purposes of isolation, followed by the growth of a gate oxide layer. A polysilicon layer is deposited, and doped, followed by another deposition of a metal silicide layer. These layers are then patterned to create a polycide gate structure. The lightly doped source and drain region, (LDD), is then formed by first ion implanting phosphorous, followed by a second blanket ion implantation, this one using arsenic. An anneal is next performed to convert the metal silicide to a crystalline structure. A deposition of an insulator layer, followed by a blanket, anisotropic dry etching procedure, create a spacer insulator on the polycide sidewall. A more heavily doped source and drain region is then achieved by blanket ion implantation of arsenic, with subsequent heat treatment resulting in the overlap of this region and the previously created LDD region. Appropriate passivation and metallization processing is then performed to provide electrical connections between specific elements.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming the MOSFET device, created by use of a phosphorous—arsenic LDD process will now be covered in detail. This LDD process can be used as part of MOSFET devices now being manufactured in industry, therefore only specific areas unique to understanding this invention will be covered in detail.

Figure 1:
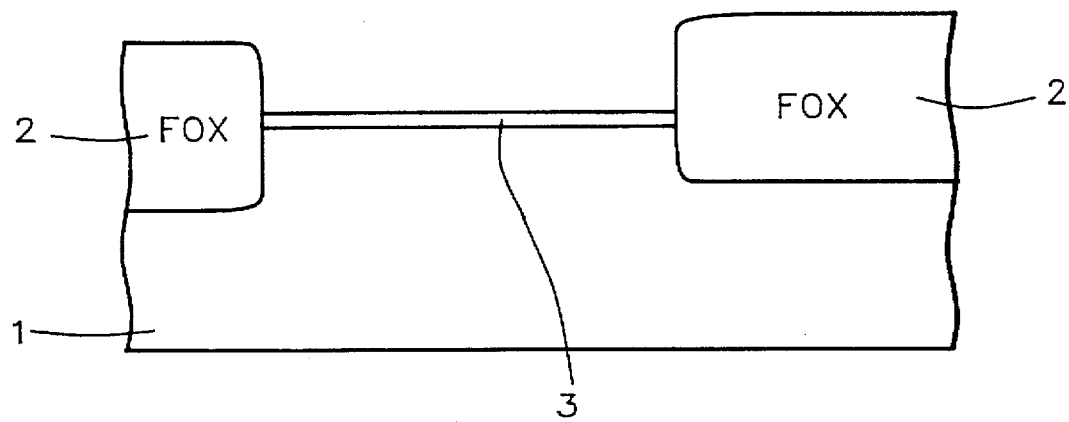
FIGS. 1–5, which schematically, in cross-sectional representation, illustrate the stages of processing the MOSFET device described in this invention.

A substrate, 1, composed of P type, single crystal silicon, with a <100> orientation, is used and shown in FIG. 1. A thick field oxide, 2, (FOX), is formed surrounding the region where the device is to be built. Briefly the method used to form the thick field oxide region is to use a thin thermal silicon dioxide film, and a silicon nitride layer, as an oxidation mask. The desired FOX region is etched open i the silicon nitride—silicon dioxide layers using conventional photolithographic techniques and dry etching processing. After removal of the masking photoresist, and a chemical clean, a thick field oxide region is grown in an oxygen—steam ambient, at a temperature between about 900° to 1050° C., to a thickness between about 4000 to 6000 Angstroms. After removal of the oxidation mask via wet processes, such as hot phosphoric acid for the silicon nitride layer, and a buffered hydrofluoric acid solution for the thin thermal oxide, another wet chemical clean is performed followed by a carefully grown gate oxide, 3, also shown in FIG. 1. The silicon dioxide gate insulator is grown in an oxygen—steam ambient, at a temperature between about 800° to 900° C., to a thickness between about 60 to 140 Angstroms.

Figure 2:
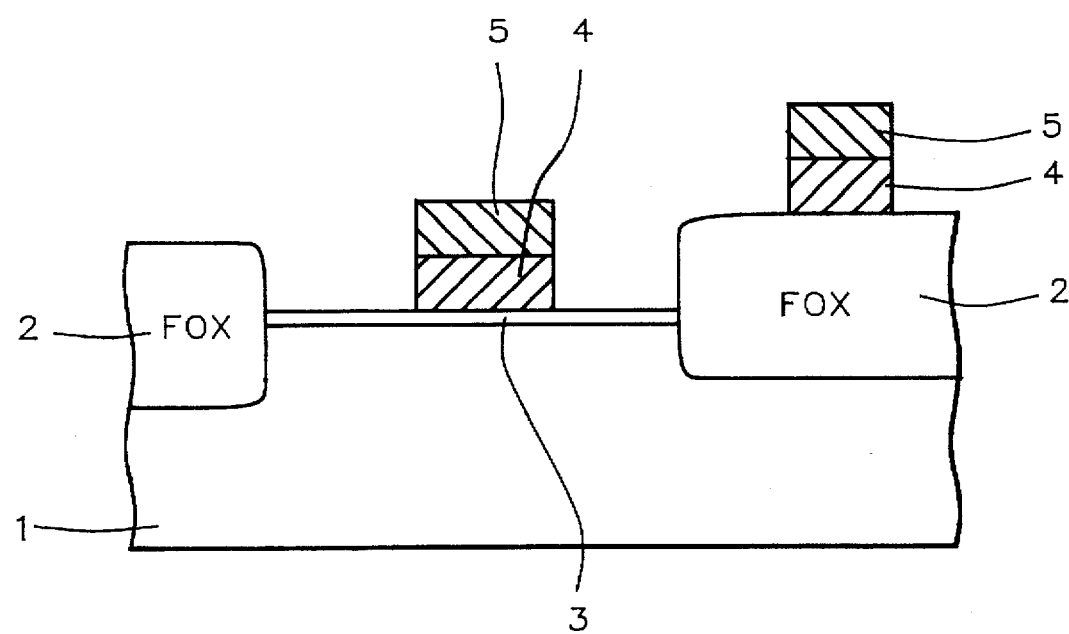

Next a polysilicon layer, 4, is grown, using low pressure chemical vapor deposition, (LPCVD), processing, at a temperature between about 570° to 620° C., to a thickness between about 1000 to 3000 Angstroms. The polysilicon layer is then doped via POCL3 processing. An alternative is to use insitu doped polysilicon, via the use of SiH4 and PH3. Another deposition of tungsten disilicide, 5, is next carried out, using LPCVD processing, to a thickness between about 1000 to 2000 Angstroms. Conventional photolithographic techniques, and reactive ion etching, (RIE), are than employed to create the tungsten disilicide-polysilicon, (polycide), structure, shown in FIG. 2. The gate oxide, 3, used as an etch stop for the RIE procedure, is used as a screen oxide for subsequent ion implantation processes. The RIE processing is performed using a Cl2 chemistry. The masking photoresist, used to create the polycide structure, is removed using oxygen plasma ashing.

Figure 3:
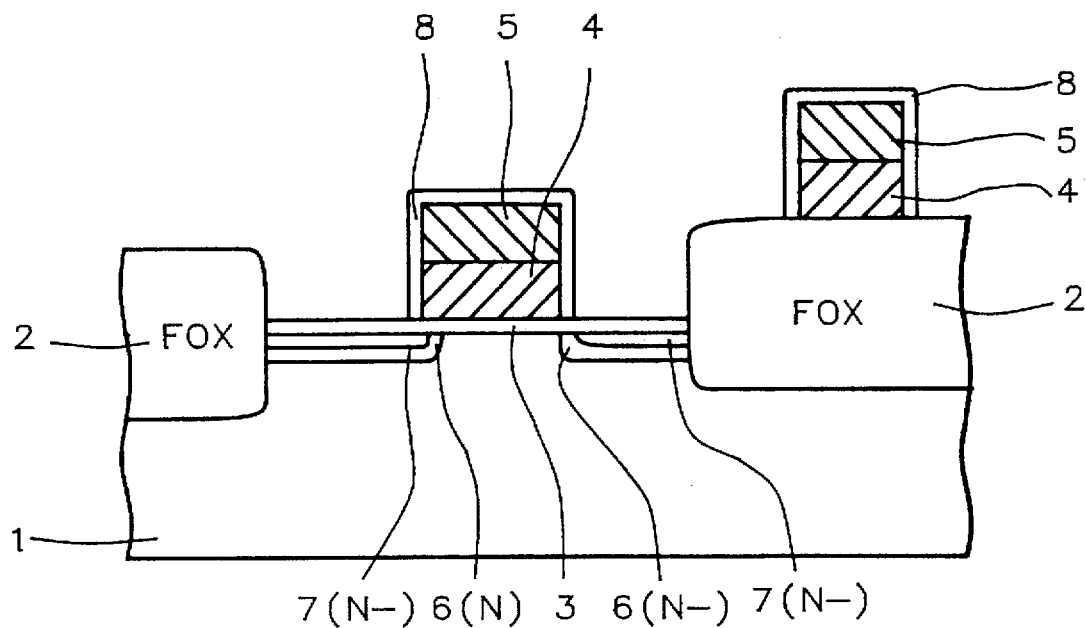

The critical LDD processing is next performed. First a ion implantation of phosphorous is performed at an energy between about 20 to 45 Kev., at a dose between about 5E12 to 1.5E13. This is shown as N type region 6, in FIG. 3. Next an arsenic ion implantation is performed at an energy between about 40 to 70 Kev., at a dose between about 4E13 to 1E14 atoms/cm2, shown as N type region 7, in FIG. 3. An anneal, used to improve the crystalline integrity of the tungsten disilicide, 5, is performed at a temperature between about 850° to 920° C., for a time of between about 45 to 75 min., in an O2+N2 ambient. The anneal results in the formation of between about 100 to 140 Angstroms of silicon oxide, 8, on the exposed polycide surfaces. The anneal also results in a greater level of diffusion or spreading of the phosphorous created, N region, 6, then of the arsenic created, N region, 7. This allows for a less severe junction gradient to exist in the channel region, between the phosphorous LD, 6, and the P substrate, 1. If the LDD was created using only an arsenic region 7, a more abrupt junction would result. The hot carrier lifetime, so critical to the reliability of MOSFET devices, improves dramatically as junction gradients decrease. Therefore the use of phosphorous, and its greater diffusivity compared to arsenic, allows a less abrupt junction to be obtained, thus offering reliability improvements. In addition the use of arsenic allows a more conductive N type region to exist, compared to regions that would have been created by use of only phosphorous LDDs. The more conductive arsenic regions offer performance advantages in terms of saturation drain current, (Idsat), and off margains, (Ioff), then counterparts that may have been fabricated only using phosphorous LDDs. Therefore an LDD process consisting of the faster diffusing, phosphorous, along with the more conductive arsenic, result in the optimum performance and reliability trade-offs needed for advanced MOSFET devices.

Figure 4:
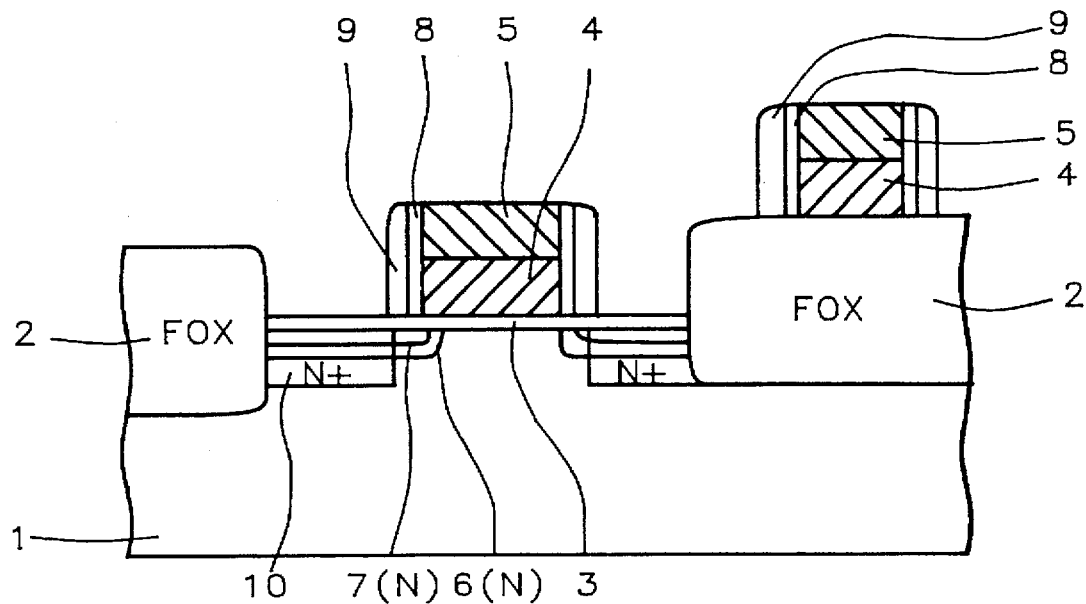

An insulator sidewall spacer, 9, is next created and shown in FIG. 4. The spacer is formed by depositing a layer of silicon oxide, via LPCVD or plasma enhanced chemical vapor deposition, using tetraethylorthosilicate, (TEOS), as a source, at a temperature between about 700° to 750° C., to a thickness between about 1000 to 2500 Angstroms. A blanket, anisotropic RIE process, using CHF3 is then used to create sidewall spacer 9. Another ion implantation process is next employed to create a N+ source and drain region, 10, shown in FIG. 4. This is accomplished via implantation of arsenic, at an energy between about 30 to 60 Kev., at a dose between about 3E15 to 5E15 atoms/cm2. An anneal, used to activate the arsenic dopants in region 10, is performed at a temperature between about 850° to 950° C.

Figure 5:
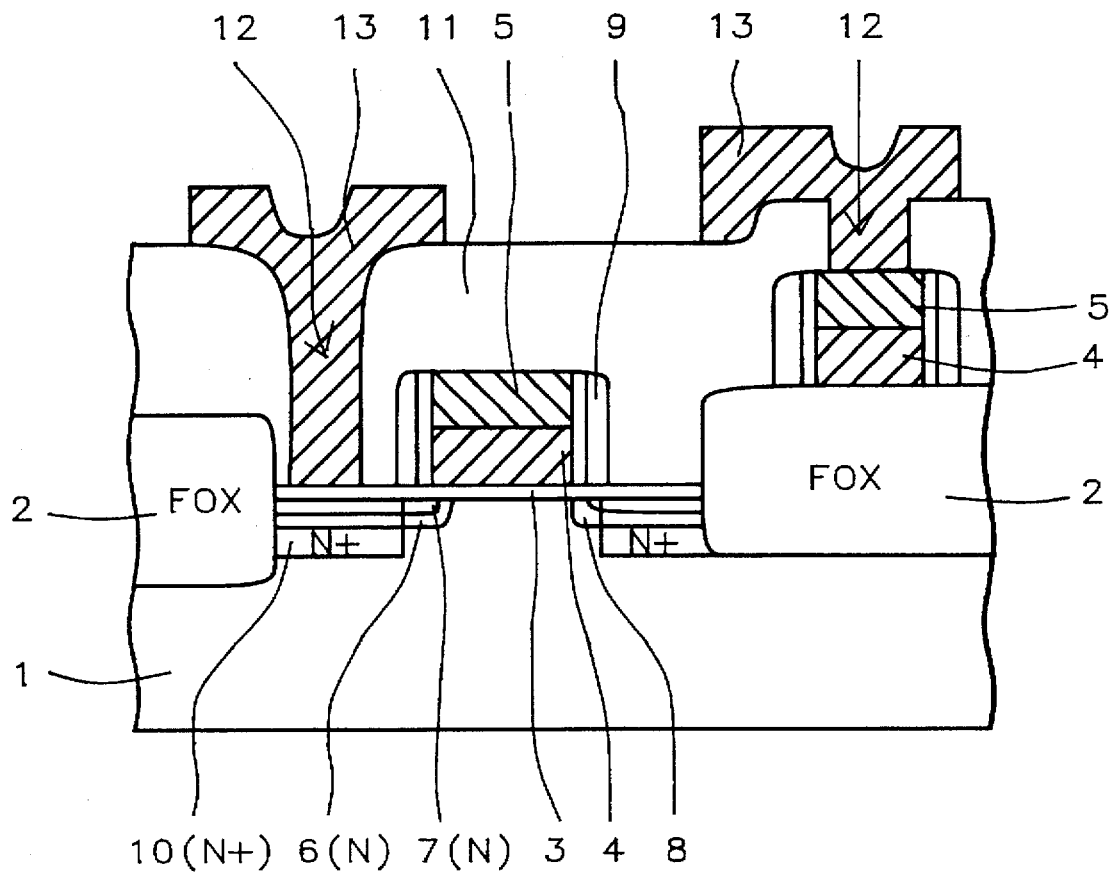

Finally the MOSFET structure is completed by deposition of a PECVD silicon oxide layer, 11, followed by conventional photolithographic patterning, and RIE processing, using CHF3 to create via 12, shown in FIG. 5. After photoresist removal, again using oxygen plasma ashing, followed by careful wet cleans, a layer, 13, of Ti—TiN—W—AL—Cu—Si, is deposited using r.f. spluttering, to a thickness between about 5000 to 8000 Angstroms. Again conventional photolithographic patterning, and RIE processing, using a Cl2 chemistry, is used to create metal structure, 13, followed by photoresist removal and wet cleans.

This novel LDD process, used to enhance MOSFET performance and reliability, although shown as a N type, MOSFET device, can also be applied to CMOS devices, where N type MOSFETs are used. In addition this invention can alao be used in BiCMOS processes, again where N type MOSFETs are being used.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, with lightly doped source and drain regions, comprising the steps of:

forming field oxide regions on said semiconductor substrate;

growing a gate oxide on said semiconductor substrate, not covered by said field oxide region;

depositing a polysilicon layer on said gate oxide, and on said field oxide regions;

doping of said polysilicon layer;

depositing a metal silicide layer on said polysilicon layer;

patterning of said metal silicide layer, and said polysilicon layer, to form polycide gate structure;

ion implanting a first conductivity imparting dopant into said semiconductor substrate, not covered by said field oxide regions, or by said polycide gate structure;

ion implanting a second conductivity imparting dopant into said semiconductor substrate, not covered by said field oxide regions, or by said polycide gate structure;

annealing of said semiconductor substrate, forming an silicon oxide layer on exposed surfaces of said polycide gate structure;

deposition of a first insulator layer;

anisotropic etching of said first insulator layer to form insulator spacer on sidewall of said polycide gate structure;

ion implanting a third conductivity imparting dopant into said semiconductor substrate, not covered by; said field oxide regions, said polycide gate structure, or said insulator spacer;

forming a second insulator layer on said semiconductor substrate, on said polycide gate structure, on said insulator spacer, and on said field oxide regions;

opening contact hole sin said second insulator layer, to said polycide gate structure, and to specific regions of said semiconductor substrate; and providing metal contact and interconnections to said polycide gate structure, and to said specific regions of said semiconductor substrate.

2. The method of claim 1, wherein said gate oxide is grown at a temperature between about 800° to 900° C., to a thickness between about 60 to 140 Angstroms.

3. The method of claim 1, wherein said polysilicon layer is grown using insitu doped LPCVD, processing, at a temperature between about 570° to 620° C., to a thickness between about 1000 to 3000 Angstroms, using silane and phosphine.

4. The method of claim 1, wherein said polysilicon is grown intrinsically at a temperature between about 570° to 620° C., to a thickness between about 1000 to 3000 Angstroms, and doped via POCl3 processing.

5. The method of claim 1, wherein said metal silicide is tungsten disilicide, deposited using LPCVD processing, at a temperature between about 350° to 370° C., to a thickness between about 1000 to 2000 Angstroms.

6. The method of claim 1, wherein said first conductivity imparting dopant is phosphourous, ion implanted at an energy between about 20 to 45 Kev., at a dose between about 5E12 to 1.5E13 atoms/cm2.

7. The method of claim 1, wherein said second conductivity imparting dopant is arsenic, ion implanted at an energy between about 40 to 70 Kev., at a dose between about 4E13 to 1E14 atoms/cm2.

8. The method of claim 1, wherein said anneal is performed in an oxygen—nitrogen ambient, at a temperature between about 850° to 920° C., for a time between about 45 to 75 min., to produce said silicon oxide layer, on said polycide gate structure, of a thickness between about 100 to 120 Angstroms.

9. The method of claim 1, wherein said first insulator layer, used to form said insulator spacer, is silicon oxide, grown using LPCVD processing, at a temperature between about 700° to 750° C., to a thickness between about 1000 to 2500 Angstroms.

10. The method of claim 1, wherein said third conductivity imparting dopant is arsenic, ion implanted at an energy between about 30 to 60 Kev., at a dose between about 3E15 to 5E15 atoms/cm2.

11. A method for fabricating a MOSFET device, on a semiconductor substrate, using a composite doping sequence to produce lightly doped source and drain regions, comprising the steps of:

forming field oxide regions on said semiconductor substrate;

growing a gate oxide on said semiconductor substrate, not covered by said field oxide regions;

depositing a polysilicon layer on said gate oxide, and on said field oxide regions doping of said polysilicon layer;

depositing a tungsten disilicide layer on said polysilicon layer;

patterning of said tungsten disilicide layer, and of said polysilicon layer, to form polycide gate structure;

ion implanting a first conductivity imparting dopant into said semiconductor substrate, not covered by said polycide gate structure, or by said field oxide region, to create specific part of said lightly doped source and drain region;

ion implanting a second conductivity imparting dopant into said semiconductor substrate, not covered by said polycide gate structure, or by said field oxide region, to create another specific part of said lightly doped source and drain region;

annealing of said semiconductor substrate, forming a silicon oxide layer on exposed surfaces of said polycide gate structure;

deposition of a first insulator layer;

anisotropic etching of said first insulator layer to form insulator spacer on sidewall of said polycide gate structure;

ion implanting a third conductivity imparting dopant into said semiconductor substrate not covered by; said polycide gate structure, said insulator spacer, or said field oxide regions, to produce heavily doped source and drain regions;

depositing a second insulator layer on said semiconductor substrate, on said polycide gate structure, on said insulator spacer, and on said field oxide regions;

opening contact holes in said second insulator layer, to said polycide gate structure, and to said heavily doped source and drain regions; and providing metal contact and interconnections to said polycide gate structure, and to said heavily doped source and drain regions.

12. The method of claim 11, wherein said gate oxide is grown at a temperature between about 800° to 900° C., to a thickness between about 60 to 140 Angstroms.

13. The method of claim 11, wherein said polysilicon layer is grown using, insitu doped, LPCVD processing, at a temperature between about 570° to 620° C., to a thickness between about 1000 to 3000 Angstroms, using silane and phosphine.

14. The method of claim 11, wherein said first polysilicon layer is grown intrinsically, at a temperature between about 570° to 620° C., to a thickness between about 1000 to 3000 Angstroms, and doped via POCl3 processing.

15. The method of claim 11, wherein said tungsten disilicide layer is deposited using LPCVD processing, at a temperature between about 350° to 370° C., to a thickness between about 1000 to 2000 Angstroms.

16. The method of claim 11, wherein said first conductivity imparting dopant is phosphorous, ion implanted at an energy between about 20 to 45 Kev., at a dose between about 5E12 to 1.5E13 atoms/cm2, for purposes of creating said lightly doped source and drain region.

17. The method of claim 11, wherein said second conductivity imparting dopant is arsenic, ion implanted at energy between about 40 to 70 Kev., at a dose between about 4E13 to 1E14 atoms/cm2, for purposes of creating said lightly doped source and drain region.

18. The method of claim 11, wherein said anneal is performed in an oxygen—nitrogen ambient, at a temperature between about 850° to 920° C., for a time between about 45 to 75 min., to produce said silicon oxide layer, on said polycide gate structure, of a thickness between about 100 to 120 Angstroms.

19. The method of claim 11, wherein said first insulator layer, used to form said insulator spacer, is silicon oxide, deposited using LPCVD processing, at a temperature between about 700° to 750° C., to a thickness between about 1000 to 2500 Angstroms.

20. The method of claim 11, wherein said third conductivity imparting dopant is arsenic, ion implanted at an energy between about 30 to 60 Kev., at a dose between about 3E15 to 5E15 atoms/cm2, for purposes of creating said heavily doped source and drain regions.

* * * * *